United States Patent [19]
Kashima et al.

[11] Patent Number: 5,994,158
[45] Date of Patent: Nov. 30, 1999

[54] METHOD OF FABRICATING AN ABRUPT HETERO INTERFACE BY ORGANOMETALLIC VAPOR PHASE GROWTH

[75] Inventors: Yasumasa Kashima; Tsutomu Munakata, both of Tokyo, Japan

[73] Assignee: Oki Electric Industry Co., Ltd., Tokyo, Japan

[21] Appl. No.: 08/788,374

[22] Filed: Jan. 24, 1997

[30] Foreign Application Priority Data

Feb. 6, 1996 [JP] Japan ................................. 8-020151

[51] Int. Cl.⁶ .................................................. H01L 21/20
[52] U.S. Cl. ................................ 438/47; 438/45; 117/89
[58] Field of Search ............................ 117/89; 438/45, 438/47

[56] References Cited

PUBLICATIONS

M. Yasuyuki et al., "Fabrication of GaInAsP/InP Heterostructure for 1.5 um Lasers by OMVPE", Transactions of the Institute of Electronics, Information and Communication Engineers of Japan, vol. E 70, pp. 121–128, Feb. 1987.

"OMPVE Growth of GaInAs/InP and GaInAs/GaIAsP Quantum Wells", Kamei et al, Journal of Crystal Growth 107 (1991) pp. 567–572.

Miyamoto Yasuyuki et al., "Fabrication of GaInAsp/InP Heterostructure For 1.5 M Lasers By OMVPE", Transactions of the Institute of Electronics, Information and Communication Engineers of Japan, Feb. 2, 1987, pp. 121–128, vol. E70, No. 2.

Imanishi et al., "Improvement of InAlAs/InP Heterinterface Grown By Movpe By Using Thin Alp Layer", Proceedings of the International Conference on Indium Phosphide and Related Materials, Santa Barbara, 3/27–31/94, pp. 575–578.

Kawabata et al., "Metalorganic Chemical Vapor Deposition of InGaAsP/InP Layers and Fabrication of 1.3–UM Planar Buried Heterostructure Lasers", Journal of Applied Physics, Oct. 1, 1988, pp. 3684–3688.

Kamei et al., "Growth of Ga1–xInxAs Layers With Excellent Compositional Uniformity on InP By OMVPE", 9/28–10/1/86, pp. 183–186, Gallium Arsenide and Related Compounds, Las Vegas and Bristol.

Kamei et al., "OMVPE Growth of GaInAs/InP and GaInAs/GaInAsP Quantum Wells", Journal of Crystal Growth, Jan. 1, 1991, pp. 567–572, vol. 107, No. 1/4.

*Primary Examiner*—Charles Bowers
*Assistant Examiner*—Keith Christianson
*Attorney, Agent, or Firm*—Venable; Robert J. Frank; Michael A. Sartori

[57] ABSTRACT

A method of fabricating an abrupt hetero interface by organometallic vapor growth comprises supplying a first Group III source gas at a predetermined flow rate and a first Group V source gas at a predetermined flow rate to a growth chamber during a first growth process to form a first Group III–Group V compound layer. During a growth interruption process, the inflow of the first Group III source gas to the growth chamber is stopped, while the supply of the first Group V source gas to the growth chamber is continued, to thereby interrupt the growth of the first Group III–Group V compound layer. Finally, during a second growth process, the first Group V source gas flowing into the growth chamber is switched to a second Group V source gas, and a second Group III source gas is simultaneously supplied at a predetermined flow rate to the growth chamber, thereby forming a second Group III–Group V compound layer on the first Group III–Group V compound layer.

31 Claims, 4 Drawing Sheets

METHOD OF FABRICATING AN ABRUPT HETERO INTERFACE BY ORGANOMETALLIC VAPOR PHASE GROWTH

BACKGROUND OF THE INVENTION

The present invention relates to a method of fabricating an abrupt hetero interface in the crystal growth of a chemical compound semiconductor multiple quantum well structure.

In the prior art, an example of this kind of technology is mentioned in the Journal of Crystal Growth Vol.107, pp. 567–572, "OMVPE growth of GaInAs/InP and GaInAs/GaInAsP quantum wells". In this reference (p.567, left column, line 21–p.569, left column, line 3, and FIG. 1), a method is indicated for growing an abrupt hetero interface comprising InP and InGaAs using an organometallic vapor growth technique.

When a InP/InGaAs interface having, for example, a multiple quantum well structure is formed by organometallic vapor growth, growth is interrupted for a short interval during the growth of the InGaAs layer and the growth of InP layer, or between growth of the InP layer and the growth of InGaAs layer, to allow valve switching and purge of residual gases in the growth chamber. At that time, P and As may separate from the growth layer surface or substitution from As to P may occur so that the quality of the hetero interface deteriorates. This is due to the fact that the vapor pressures of P and As, which are Group V elements, are high. It is thus important to prevent the separation of Group V elements and substitution so as to improve the quality of the hetero interface.

The method for fabricating a InGaAs/InP hetero interface by growing a InGaAs layer on a InP layer given in the aforesaid reference, is described below. FIG. 1 is a diagram showing a timing at which a source gas is switched over in the conventional process for fabricating a hetero interface disclosed in the above reference.

Firstly, trimethylindium (TMIn) and phosphine ($PH_3$) are supplied to a growth chamber, and a InP layer is grown. Immediately after growth of the InP layer, supply of TMIn is stopped, and passage of $PH_3$ is continued for t1 seconds to purge TMIn from the growth chamber. The source gas is then switched from $PH_3$ gas to arsine ($AsH_3$) gas, and $AsH_3$ gas is supplied to the growth chamber for t2 seconds. After T2 seconds, TMIn and triethylgallium (TEGa) are supplied to the growth chamber, and a InGaAs layer is grown. t1 and T2 are growth interruption intervals. The optimum intervals are calculated to be t1=T2=0.5 seconds. When fabricating a InP/InGaAs hetero interface, the times for which arsine and phosphine are supplied are reversed, but the same method and times are used.

However, if a InGaAsP layer was grown on a InGaAs layer or a InGaAs layer was grown on a InGaAsP layer when the growth interruption condition shown above was t1=t2= 0.5 seconds, for example, a substitution from As to P occurred on the InGaAs surface for t1 seconds causing a deterioration of the hetero interface.

SUMMARY OF THE INVENTION

It is therefore an object of the present invention to provide a method of fabricating an abrupt hetero interface by organometallic vapor growth wherein deterioration of the hetero interface can be prevented.

According to the present invention, a method of fabricating an abrupt hetero interface by organometallic vapor growth includes: the steps of: supplying a first Group III source gas at a predetermined flow rate and a first Group V source gas at a predetermined flow rate to a growth chamber during a first growth process, thereby forming a first Group III–Group V compound layer; causing inflow of the first Group III source gas to the growth chamber to be stopped and keeping on supplying the Group V source gas to the growth chamber during a growth interruption process, thereby interrupting the growth of the first Group III–Group V compound layer; and changing the flow rate of the first Group V source gas to the growth chamber and simultaneously starting supply of a second Group III source gas at a predetermined flow rate to the growth chamber during a second growth process, thereby forming a second Group III–Group V compound layer on the first Group III–Group V compound layer.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The preferred embodiments of the present invention will now be described in detail with reference to the appended drawings.

First Embodiment

Figure 2:
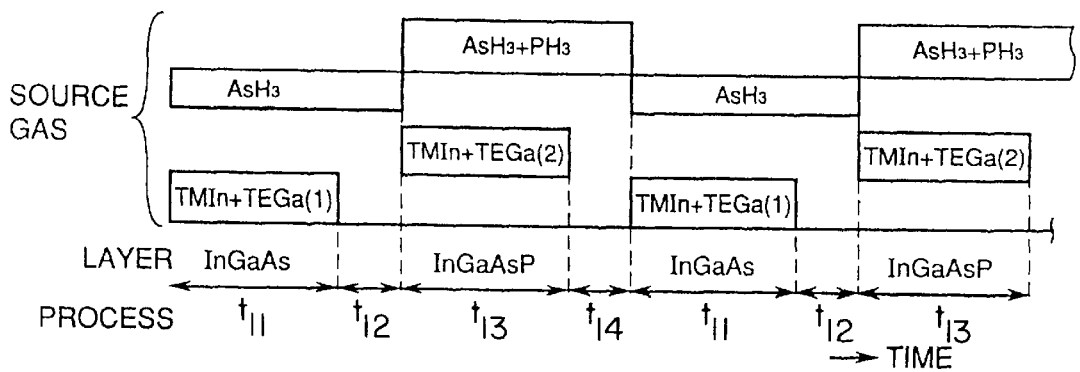
FIG. 2 is a diagram showing the timing with which a source gas is switched over in the method of fabricating a hetero interface according to a first embodiment of the present invention.

FIG. 2 is a diagram showing a timing with which a source gas is switched over in a method of fabricating a hetero interface according to a first embodiment of the present invention.

A description will be given of how, according to the first embodiment, a InGaAsP layer is grown on a InGaAs layer (band gap wavelength 1.2 [$\mu$m]) so as to fabricate a InGaAsP/InGaAs hetero interface, or in other words, how InGaAsP/InGaAs multiple quantum wells are grown.

In the method of fabricating a hetero interface according to the first embodiment, a Group III source gas is first supplied at a predetermined flow rate to a growth chamber and simultaneously a Group V source gas is supplied at a predetermined flow rate, thereby growing a InGaAs layer as a Group III–Group V compound layer, as shown by t11 in FIG. 2. In this InGaAs layer growth step, the Group III source gas is a first mixed gas (TMIn+TEGa(1)) of trimethylindium (TMIn) and triethylgallium (TEGa), and the Group V source gas is arsine ($AsH_3$) gas. For the invention, trimethylgallium (TmGa) can be substituted for triethylgallium TEGa.

The Group V/III ratio (ratio of the Group V source gas to the Group III source gas) in the InGaAs layer growth step lies in the range of 50 to 150. The temperature in the growth chamber lies in the range of 600° C. to 700° C., and the pressure in the growth chamber lies in the range of 50 [Torr] to 200 [Torr]. The InGaAs layer growth rate is 0.7 [μm/s].

Next, inflow into the growth chamber of the mixed gas (TMIn+TEGa(1)) of TMIn and TEGa as a Group III source gas is stopped, and inflow of the $AsH_3$ gas as a Group V source gas, is continued alone, thereby interrupting growth of the InGaAs layer. The temperature in the growth chamber at this time lies in the range of 600° C. to 700° C., and the pressure in the growth chamber lies in the range of 50 [Torr] to 200 [Torr].

Next, the Group V source gas flowing into the growth chamber is switched to a mixed gas ($AsH_3+PH_3$) of $AsH_3$ and $PH_3$ and a Group III source gas is simultaneously supplied at a predetermined flow rate, as shown by t13 in FIG. 2. In this way, a InGaAsP Group III–Group V compound layer is grown on the InGaAs layer so as to fabricate the InGaAs/InGaAsP hetero interface. The Group III source gas used in the InGaAsP layer growth step is a mixed gas (TMIn+TEGa(2)) of TMIn and TEGa. The mixing ratio (TMIn/TEGa) of this mixed gas (TMIn+TEGa(2)) is set at a different value to that of the mixed gas (TMIn+TEGa(1)). Also the V/III ratio (i.e., mixing ratio of the Group V source gas to the Group III source gas) in the InGaAsP layer growth step lies in the range of 200 to 250. The growth temperature lies in the range of 600° C. to 700° C., and the pressure lies in the range of 50 [Torr] to 200 [Torr]. The speed of growth of the InGaAs layer is 0.9 [μm/s].

Next, supply of the mixed gas (TMIn+TEGa(2)) as a Group III source gas to the growth chamber is stopped and supply of the mixed gas ($AsH_3+PH_3$) as a Group V source gas is continued alone so as to interrupt growth of the InGaAsP layer, as shown by t14 in FIG. 2. The temperature in the growth chamber at this time lies in the range of 600° C. to 700° C., and the pressure lies in the range of 50 [Torr] to 200 [Torr].

To fabricate multiple quantum wells structure, the aforesaid steps t11–t14 are repeated.

Figure 1:
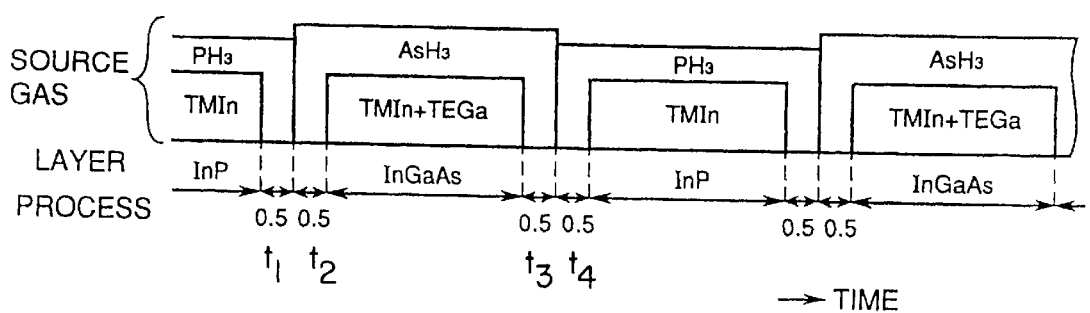
FIG. 1 is a diagram showing the timing with which a source gas was switched over in the conventional method of fabricating a hetero interface.

As described hereinabove, in the method of fabricating a hetero interface according to the first embodiment, supply of $AsH_3$ gas to the growth chamber is continued during the growth interruption step (t12) from the end of the InGaAs layer growth step (t11) to the start of the InGaAsP layer growth step (t13), and there is no switch over from $AsH_3$ gas to $PH_3$ gas in the growth interruption step as shown in FIG. 1 (prior art). Separation of As from the InGaAs layer surface in the growth interruption step (t12) is therefore suppressed, and substitution from As to P or from P to As in the surface of the InGaAs layer is prevented.

Further, supply of the mixed gas ($AsH_3+PH_3$) to the growth chamber is continued during the growth interruption step (t14) from the end of the InGaAsP layer growth step (t13) to the start of the InGaAs layer growth step (t11), and there is no switch over from the mixed gas($AsH_3+PH_3$) to $AsH_3$ gas in the growth interruption step as shown in FIG. 1 (prior art). Separation of As or P from the InGaAsP layer surface in the growth interruption step (t14) is therefore suppressed, and substitution from As to P or from P to As in the surface of the InGaAsP layer is prevented.

Figure 3A:
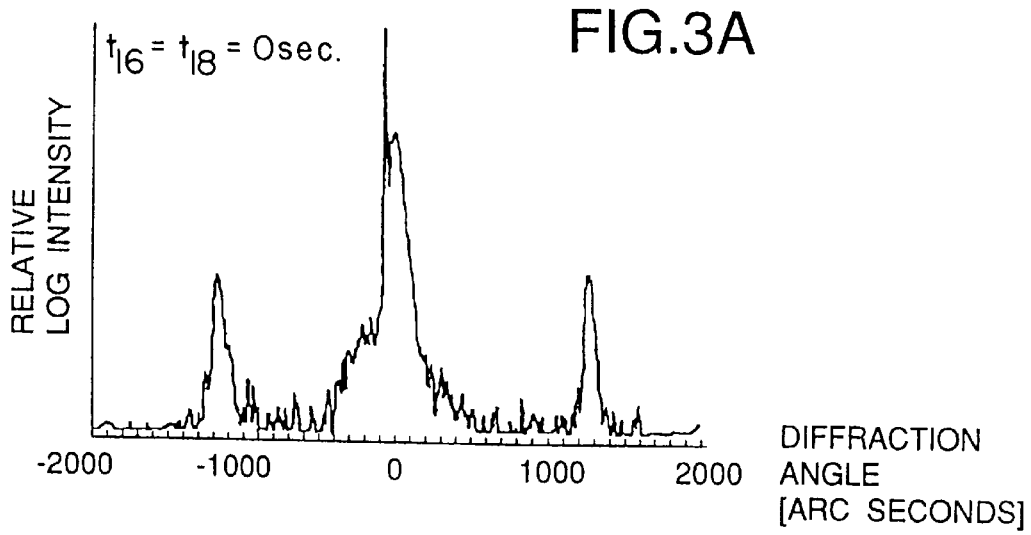
FIGS. 3A–3C show the crystal properties of a multiple quantum well structure having a hetero interface produced by the fabrication method of the first embodiment and those of comparative examples.
Figure 3B:
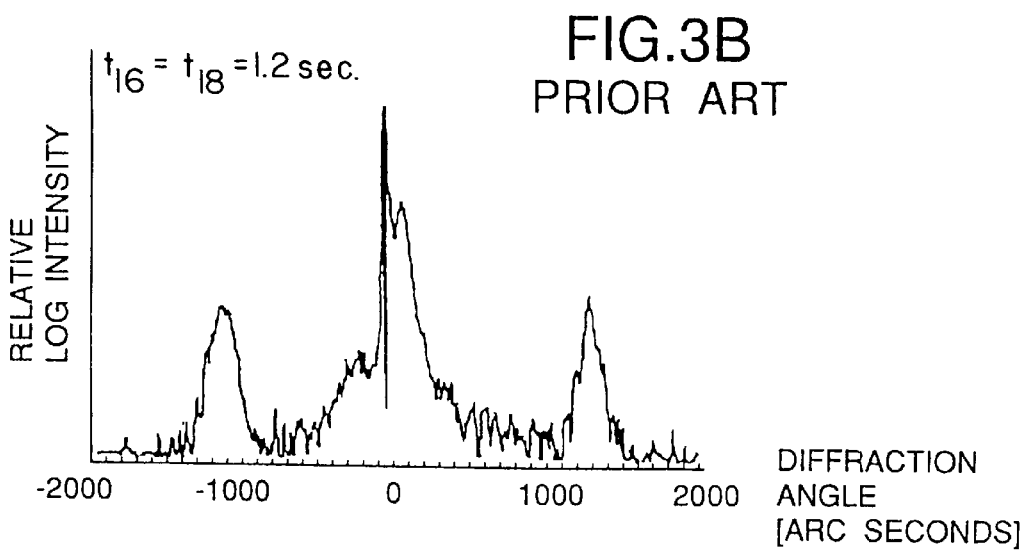
Figure 3C:
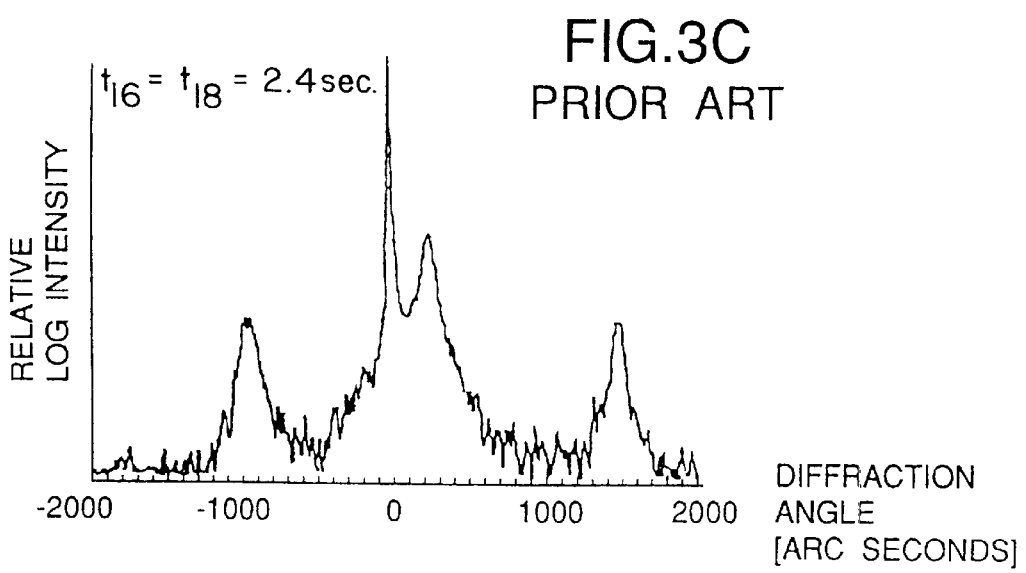
Figure 4:
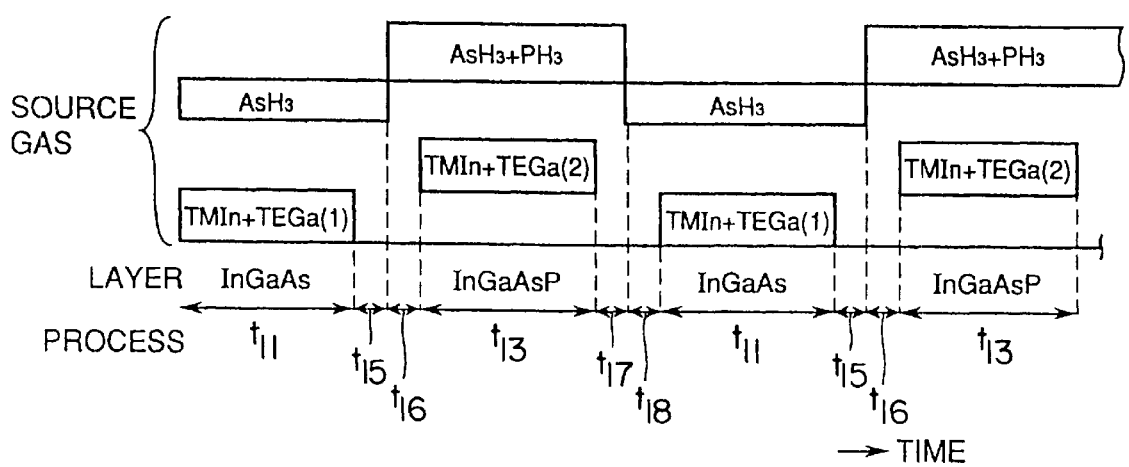
FIG. 4 is a diagram showing the timing with which the source gas is switched over in the comparative examples of FIGS. 3B and 3C.

FIG. 3A shows the crystal properties of a multiple quantum well structure comprising a InGaAs/InGaAsP hetero interface grown by the fabrication method according to the first embodiment. FIG. 3B shows the crystal properties of a multiple quantum well structure comprising a InGaAs/InGaAsP hetero interface grown by the fabrication method of the comparative example in FIG. 4 with t16=t18=1.2 seconds. FIG. 3C shows the crystal properties of a multiple quantum well structure comprising a InGaAs/InGaAsP hetero interface grown by the fabrication method of the comparative example in FIG. 4 with t16=t18=2.4 seconds. In FIGS. 3A–3C, the vertical axis shows relative log intensity and the horizontal axis shows diffraction angle (arc seconds).

The multiple quantum well structure thus formed comprises 20 pairs of InGaAs well layers (7 [nm]) and InGaAsP (bandgap wavelength 1.2 [μm]) barrier layers (10 [nm]).

As shown in FIG. 3A, in the case of growth interruption in the fabrication method according to the first embodiment (corresponding to t16=t18=0 seconds), the half-value amplitudes of the 0th and 1st order satellite peaks are narrow, and a high quality hetero interface is obtained. On the other hand, when t16 and t18 increased as shown In FIGS. 3B and 3C, the half-value amplitudes of the 0th and 1st order satellite peaks was broadened, and the 0th order satellite peak was shifted to the P rich side. TABLE 1 shows an evaluation obtained by photoluminescence of a sample having the properties of FIGS. 3A–3C.

TABLE 1

| Growth interruption T16 [sec] | Photoluminescenc peak wavelength [nm] (25° C.) | Width at half maximum [MeV] (25° C.) |
| --- | --- | --- |
| 0 | 1581 | 31.8 |
| 1.2 | 1568 | 40.1 |
| 2.4 | 1564 | 49.8 |

From TABLE 1, it is seen that for growth interruption as in the fabrication method according to the first embodiment (t16=t18=0 seconds), the width at half maximum of the photoluminescence are narrow and a high quality hetero interface is obtained. On the other hand, when t16 and t18 in FIG. 4 increased, the width at half maximum of photoluminescence broadens and is shifted to shorter wavelengths. These results show that by supplying the Group V source gas and the Group III source gas simultaneously to the growth chamber immediately after growth is interrupted, substitution from As to P on the InGaAs surface is suppressed.

Therefore, when a multiple quantum well structure comprising a InGaAs/InGaAsP hetero interface is fabricated by organometallic vapor phase growth and the Group V source gas and the Group III source gas are simultaneously supplied to the growth chamber immediately after interrupting growth, separation and substitution of Group V elements in the hetero interface are prevented. A high quality hetero interface can therefore be fabricated, and the quality of the multiple quantum well structure can be improved.

Second Embodiment

Figure 5:
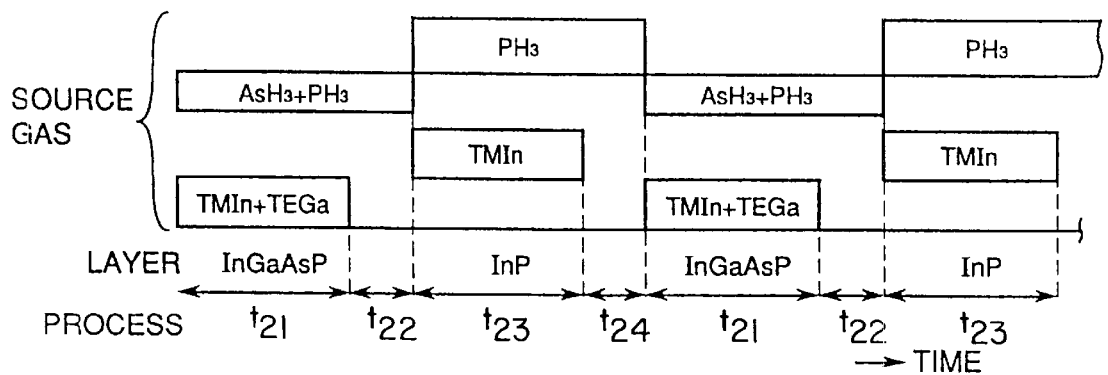
FIG. 5 is a diagram showing the timing with which a source gas is switched over in the method of fabricating a hetero interface according to a second embodiment of the present invention.

FIG. 5 is a diagram showing the timing with which a source gas is switched over in a method of fabricating a hetero interface according to a second embodiment of the present invention.

In the method of fabricating a hetero interface according to the second embodiment, by supplying a Group III source gas at a predetermined flow rate and a Group V source gas at a predetermined flow rate to the growth chamber, a InGaAsP layer as a Group III–Group V compound layer is first grown as shown by t21 in FIG. 5. In this InGaAsP layer growth step, the Group III source gas is a mixed gas (TMIn+TEGa) of TMIn and TEGa, and the Group V source gas is a mixed gas ($AsH_3+PH_3$) of $AsH_3$ and $PH_3$.

Next, supply of the mixed gas (TMIn+TEGa) as the Group III source gas to the growth chamber is stopped and supply of the mixed gas ($AsH_3+PH_3$) as the Group V source gas is continued alone so as to interrupt the growth of the InGaAsP layer, as shown by t22 in FIG. 5.

Next, the Group V source gas flowing into the growth chamber is switched to $PH_3$ gas and simultaneously supply of a Group III source gas at a predetermined flow rate is started so as to grow a InP layer as a Group III–Group V compound layer on the InGaAsP layer, thereby fabricating a InGaAsP/InP hetero interface, as shown by t23 in FIG. 5. The Group III source gas in this InP layer growth step is TMIn.

Next, inflow to the growth chamber of the Group III source gas TMIn is stopped and supply of $PH_3$ gas as the Group V source gas is continued alone so as to interrupt growth of the InP layer, as shown by t24 in FIG. 5.

In the aforesaid steps, the temperature in the growth chamber lies in the range of 600° C. to 700° C. and the pressure in the growth chamber lies in the range of 50 [Torr] to 200 [Torr].

As described hereinabove, in the method of fabricating a hetero interface according to the second embodiment, supply of the mixed gas ($AsH_3+PH_3$) to the growth chamber is continued during the growth interruption interval (t22) from the end of the InGaAsP layer growth step (t21) to the start of the InP layer growth step (t23). Separation of As from the surface of the InGaAsP layer in the growth interruption step (t22) is therefore suppressed, and substitution from As to P in the surface of the InGaAs layer Is prevented.

Further, supply of $PH_3$ gas to the growth chamber is continued during the growth interruption interval (t24) from the end of the InP layer growth step (t23) to the start of the next InGaAsP layer growth step (T21). Separation of P from the surface of the InP layer in the growth interruption step (t24) is therefore suppressed, and substitution from P to As in the surface of the InP layer is prevented.

Third Embodiment

Figure 6:
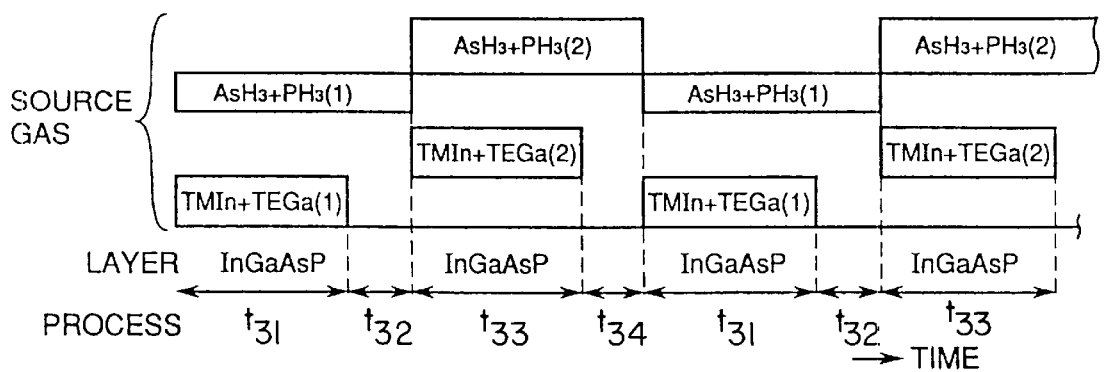
FIG. 6 is a diagram showing the timing with which a source gas is switched over in the method of fabricating a hetero interface according to a third embodiment of the present invention.

FIG. 6 is a diagram showing a timing with which a source gas is switched over in a method of fabricating a hetero interface according to a third embodiment of the present invention.

In the method of fabricating a hetero interface according to the third embodiment, a Group III source gas at a predetermined flow rate and a Group V source gas at a predetermined flow rate are first supplied to a growth chamber so as to grow a first InGaAsP layer as a first Group III–Group V compound layer, as shown by t31 in FIG. 6. In this first InGaAsP layer growth step, the Group III source gas is a mixed gas (TMIn+TEGa(1)) in which TMIn and TEGa are mixed at a predetermined mixing ratio R1, and the Group V source gas is a mixed gas ($AsH_3+PH_3$(1)) in which $AsH_3$ and $PH_3$ are mixed at a predetermined mixing ratio R2.

Next, inflow to the growth chamber of the mixed gas (TMin+TEGa(1)) as the first Group III source gas is stopped and supply of the mixed gas ($AsH_3+PH_3$(1)) as the first Group V source gas is continued alone so as to interrupt growth of the first InGaAsP layer, as shown by t32 in FIG. 6.

Next, the first Group V source gas flowing into the growth chamber is switched to a mixed gas ($AsH_3+PH_3$(2)) as a second Group V source gas and a Group III source gas is simultaneously start to be supplied at a predetermined flow rate, as shown by t33 in FIG. 6. In this way, a second InGaAsP layer as a Group III–Group V compound layer is grown on the first InGaAsP layer so as to fabricate a InGaAsP/InGaAsP hetero interface. The Group III source gas used in this second InGaAsP layer growth step is a mixed gas (TMIn+TEGa(2)) in which TMIn and TEGa have a predetermined mixing ratio R3 (R1≠R3).

Next, supply of the mixed gas (TMIn+TEGa(2)) as the Group III source gas to the growth chamber is stopped and supply of the mixed gas ($AsH_3+PH_3$) as the Group V source gas is continued alone so as to interrupt growth of the second InGaAsP layer, as shown by T34 in FIG. 6.

In the aforesaid steps, the temperature In the growth chamber lies in the range of 600° C. to 700° C., and the pressure lies in the range of 50 [Torr] to 200 [Torr].

As described hereinabove, in the method of fabricating a hetero interface according to the third embodiment, supply of the mixed gas ($AsH_3+PH_3$(1)) mixture continues during the growth interruption step (t32) from the end of the first InGaAsP layer growth step (t31) to the start of the second InGaAsP layer growth step (t33). Separation of As or P from the InGaAsP layer surface in the growth interruption step (t32) is therefore suppressed, and substitution from As to P or from P to As in the surface of the first InGaAs layer is prevented.

Also, supply of the mixed gas ($AsH_3+PH_3$(2)) to the growth chamber is continued during the growth interruption interval (t34) from the end of the second InGaAsP layer growth step (t33) to the start of the next first InGaAsP layer growth step (t31). Separation of As from the surface of the second InGaAsP layer in the growth interruption step (t34) is therefore suppressed, and substitution from As to P or from P to As in the surface of the second InGaAsP layer is prevented.

The present invention is not limited to the aforesaid embodiments, various modifications being possible within the scope and spirit of the appended claims.

What is claimed is:

1. A method of fabricating an abrupt hetero interface by organometallic vapor growth, comprising the steps of:

supplying a first Group III source gas at a predetermined flow rate and a first Group V source gas at a predetermined flow rate to a growth chamber during a first growth process, thereby forming a first Group III––Group V compound layer, wherein said first Group V source gas is a mixed gas including $AsH_3$ and PH3 gases;

stopping the supplying of said first Group III source gas to said growth chamber and continuing to supply said first Group V source gas to said growth chamber during a growth interruption process, thereby interrupting the growth of said first Group III–Group V compound layer; and switching said first Group V source gas flowing into said growth chamber to a second Group V source gas including $PH_3$ gas and simultaneously supplying a second Group III source gas at a predetermined flow rate to said growth chamber during a second growth process, thereby forming a second Group III–Group V compound layer on said first Group III–Group V compound layer.

2. A fabrication method of claim 1, wherein:

said first Group V source gas is a mixed gas of $AsH_3$ and $PH_3$; and said second Group V source gas is $PH_3$ gas.

3. A fabrication method of claim 1, wherein:
said first Group V source gas is a first mixed gas of $AsH_3$ and $PH_3$ in which $AsH_3$ and $PH_3$ are mixed in a first proportion; and
said second Group V source gas is a second mixed gas of $AsH_3$ and $PH_3$ in which $AsH_3$ and $PH_3$ are mixed in a second proportion.

4. A fabrication method of claim 1, wherein:
said first Group III source gas is a first mixed gas of TMIn and TEGa in which TMIn and TEGa are mixed in a first proportion; and
said second Group III source gas is a second mixed gas of TMIn and TEGa in which TMIn and TEGa are mixed in a second proportion.

5. A fabrication method of claim 4, wherein:
said second Group V source gas is $AsH_3$;
said first Group III–Group V compound layer is an InGaAsP layer; and
said second Group III–Group V compound layer is an InGaAs layer.

6. A fabrication method of claim 5, wherein:
a flow ratio of said mixed gas of $AsH_3$ and $PH_3$ to said first mixed gas to TMIn and TEGa during said first growth process for forming said InGaAsP layer lies in a range of 200 to 250.

7. A fabrication method of claim 5, wherein:
a flow ratio of said $AsH_3$ gas to said second mixed gas to TMIn and TEGa during said second growth process for forming said InGaAs layer lies in a range of 50 to 150.

8. A fabrication method of claim 4, wherein:
said first Group V source gas is a mixed gas of $AsH_3$ and $PH_3$ in which $AsH_3$ and $PH_3$ are mixed in a first mixing ratio;
said second Group V source gas is a mixed gas of $AsH_3$ and $PH_3$ in which $AsH_3$ and $PH_3$ are mixed in a second mixing ratio;
said first Group III–Group V compound layer is a first InGaAsP layer having a first composition; and
said second Group III–Group V compound layer is a second InGaAsP layer having a second composition.

9. A fabrication method of claim 1, wherein:
said first Group III source gas is a mixed gas of TMIn and TEGa;
said second Group III source gas is TMIn gas;
said first Group III–Group V compound layer is an InGaAsP layer; and
said second Group III–Group V compound layer is an InP layer.

10. A fabrication method of claim 1, wherein:
a temperature in said growth chamber during said first growth process and said second growth process lies in a range of 600° C. to 700° C.

11. A fabrication method of claim 1, wherein:
a pressure in said growth chamber during said first growth process and said second growth process lies in a range of 50 Torr 200 Torr.

12. A fabrication method of claim 1, wherein:
hydrogen is continuously supplied as a carrier gas to said growth chamber throughout said first growth process, said interruption process and said second growth process.

13. A method of fabricating an abrupt hetero interface by organometallic vapor growth, comprising the steps of:
performing a first growth step to form a first Group III–Group V compound layer, the first growth step comprising furnishing a first Group III source gas and a first Group V source gas to a growth chamber, wherein said first Group V source gas is a mixed gas including $AsH_3$ and $PH_3$ gases;
performing a growth interruption step to interrupt the forming of the first Group III–Group V compound layer, the growth interruption step comprising ceasing the furnishing of the first Group III source gas to the growth chamber while continuing the furnishing of the first Group V source gas to the growth chamber; and
performing a second growth step to form a second Group III–Group V compound layer on said first Group III–Group V compound layer, the second growth step comprising furnishing a second Group III source gas to the growth chamber, ceasing the furnishing of the first Group V source gas to the growth chamber, and furnishing a second Group V source gas, including $PH_3$ gas, to the growth chamber.

14. An abrupt hetero interface fabricated by organometallic vapor growth, the interface comprising:
a first Group III–Group V compound layer formed by supplying a first Group III source gas and a first Group V source gas to a growth chamber during a first growth process, wherein said first Group V source gas is a mixed gas including $AsH_3$ and $PH_3$ gases; and
a second Group III–Group V compound layer formed on the first Group III–Group V layer during a second growth process occurring after the first growth process and a growth interruption process, the growth interruption process occurring after the first growth process and before the second growth process and comprising stopping the supplying of the first Group III source gas to the growth chamber and continuing the supplying of the first Group V source gas to the growth chamber, the second growth process comprising substituting a second Group V source gas, including $PH_3$, for the first Group V source gas in the growth chamber and supplying a second Group III source gas to the growth chamber.

15. A method of fabricating an abrupt hetero interface by organometallic vapor growth, comprising the steps of:
supplying a first Group III source gas at a predetermined flow rate and a first Group V source gas at a predetermined flow rate to a growth chamber during a first growth process, thereby forming a first Group III–Group V compound layer, wherein said first Group V source gas includes $PH_3$;
stopping the supplying of said first Group III source gas to said growth chamber and continuing to supply said first Group V source gas to said growth chamber during a growth interruption process, thereby interrupting the growth of said first Group III–Group V compound layer;
switching said first Group V source gas flowing into said growth chamber to a second Group V source gas, said second Group V source gas including $AsH_3$ and $PH_3$ gases, and simultaneously supplying a second Group III source gas at a predetermined flow rate to said growth chamber during a second growth process, thereby forming a second Group III–Group V compound layer on said first Group III–Group V compound layer;
stopping the supplying of said second Group III source gas to said growth chamber and continuing to supply said Group V source gas to said growth chamber during a second growth interruption process, thereby interrupting the growth of said second Group III–Group V compound layer; and switching said second Group V source gas flowing into said growth chamber to said first Group V source gas and simultaneously supplying said first Group III source gas at a predetermined flow rate to said growth chamber during a third growth process, thereby forming a third Group III–Group V compound layer on said second Group III–Group V compound layer.

16. A fabrication method of claim 15, wherein:
said first Group V source gas is $AsH_3$ gas.

17. A fabrication method of claim 15, wherein:
said first Group V source gas is a mixed gas of $AsH_3$ and $PH_3$;
said second Group V source gas is $PH_3$.

18. A fabrication method of claim 15, wherein:
said first Group V source gas is a first mixed gas of $AsH_3$ and $PH_3$ in which $ASH_3$ and $PH_3$ are mixed in a first proportion; and
said second Group V source gas is a second mixed gas of $AsH_3$ and $PH_3$ in which $AsH_3$ and $PH_3$ are mixed in a second proportion.

19. A fabrication method of claim 15, wherein:
said first Group III source gas is a first mixed gas of TMIn and TEGa in which TMIn and TEGa are mixed in a first proportion; and
said second Group III source gas is a second mixed gas of TMIn and TEGa in which TMIn and TEGa are mixed in a second proportion.

20. A fabrication method of claim 19, wherein:
said first Group V source gas is $AsH_3$;
said first Group III–Group V compound layer is an InGaAs layer; and
said second Group III–Group V compound layer is an InGaAsP layer.

21. A fabrication method of claim 20, wherein:
a flow ratio of said $AsH_3$ gas to said first mixed gas of TMIn and TEGa during said first growth process for forming said InGaAs layer lies in a range of 50 to 150.

22. A fabrication method of claim 20, wherein:
a flow ratio of said mixed gas of $AsH_3$ and $PH_3$ to said second mixed gas of TMIn and TEGa during said second growth process for forming said InGaAsP layer lies in a range of 200 to 250.

23. A fabrication method of claim 19, wherein:
said first Group V source gas is a mixed gas of $AsH_3$ and $PH_3$;
said second Group V source gas is $AsH_3$;
said first Group III–Group V compound layer is an InGaAsP layer; and
said second Group III–Group V compound layer is an InGaAs layer.

24. A fabrication method of claim 23, wherein:
a flow ratio of said mixed gas of $AsH_3$ and $PH_3$ to said first mixed gas to TMIn and TEGa during said first growth process for forming said InGaAsP layer lies in a range of 200 to 250.

25. A fabrication method of claim 23, wherein:
a flow ratio of said $AsH_3$ gas to said second mixed gas to TMIn and TEGa during said second growth process for forming said InGaAs layer lies in a range of 50 to 150.

26. A fabrication method of claim 19, wherein:
said first Group V source gas is a mixed gas of $AsH_3$ and $PH_3$ in which $AsH_3$ and $PH_3$ are mixed in a first mixing ratio;
said second Group V source gas is a mixed gas of $AsH_3$ and $PH_3$ in which $AsH_3$ and $PH_3$ are mixed in a second mixing ratio;
said first Group III–Group V compound layer is a first InGaAsP layer having a first composition; and
said second Group III–Group V compound layer is a second InGaAsP layer having a second composition.

27. A fabrication method of claim 16, wherein:
said first Group III source gas is a mixed gas of TMIn and TEGa;
said second Group III source gas is TMIn gas;
said first Group V source gas is a mixed gas of $AsH_3$ and $PH_3$;
said second Group V source gas is $PH_3$ gas;
said first Group III–Group V compound layer is a InGaAsP layer; and
said second Group III–Group V compound layer is a InP layer.

28. A fabrication method of claim 15, wherein:
said first Group III source gas is TMIn gas;
said second Group III source gas is a mixed gas of TMIn and TEGa;
said first Group V source gas is $PH_3$ gas;
said second Group V source gas is a mixed gas of $AsH_3$ and $PH_3$;
said first Group III–Group V compound layer is a InP layer; and
said second Group III–Group V compound layer is a InGaAsP layer.

29. A fabrication method of claim 15, wherein:
a temperature in said growth chamber during said first growth process and said second growth process lies in a range of 600° C. to 700° C.

30. A fabrication method of claim 15, wherein:
a pressure in said growth chamber during said first growth process and said second growth process lies in a range of 50 Torr to 200 Torr.

31. A fabrication method of claim 15, wherein:
hydrogen is continuously supplied as a carrier gas to said growth chamber throughout said fist growth process, said interruption process and said second growth process.

* * * * *